United States Patent [19]

Clariou

[11] Patent Number: 4,738,746

[45] Date of Patent: Apr. 19, 1988

[54] PROCESS FOR MAKING ELECTRICALLY CONDUCTIVE LINES ON A NON-DEVELOPABLE SURFACE OF AN INSULATING SUBSTRATE, TOOL FOR CARRYING OUT THE PROCESS AND DEVICE OBTAINED THEREBY

[75] Inventor: Jean-Pierre Clariou, Maisons-Laffitte, France

[73] Assignee: Societe Nationale Industrielle et Aerospatiale, Paris, France

[21] Appl. No.: 26,943

[22] Filed: Mar. 17, 1987

[30] Foreign Application Priority Data

Mar. 19, 1986 [FR] France .................................. 86 03928

[51] Int. Cl.⁴ .......................... B44C 1/22; C23F 1/02; C03C 15/00; C03C 25/06
[52] U.S. Cl. ........................................ 156/631; 29/846; 156/645; 156/656; 156/658; 156/659.1; 156/902
[58] Field of Search ............ 156/631, 645, 656, 659.1, 156/658, 233, 248, 267, 268, 510, 901, 902; 29/846

[56] References Cited

U.S. PATENT DOCUMENTS

| 2,632,693 | 3/1953 | Jenkins | 156/645 |
| 2,969,300 | 1/1961 | Franz | 156/233 |
| 3,960,622 | 6/1976 | Hofling et al. | 156/645 |
| 4,584,039 | 4/1986 | Shea | 156/631 X |
| 4,585,519 | 4/1986 | Jaffe et al. | 156/645 |

Primary Examiner—William A. Powell
Attorney, Agent, or Firm—Fisher, Christen & Sabol

[57] ABSTRACT

This invention relates to a process for making electrically conductive lines on a non-developable surface of an insulating substrate, to a tool for carrying out the process and to a device obtained thereby. The process consists in uniformly coating the surface of a layer of an electrically conductive matter, which is in turn coated with a layer of a protective matter. The contour of the lines is then traced mechanically on the layers by means of a tool hollowing out grooves, then the layers are subjected to the action of a chemical agent capable of attacking the layer of conductive matter without attacking the protective layer, after which those parts of the electrically conductive layer outside the lines are separated from the substrate by peeling. The invention is applicable, for example, to the making of electrically conductive lines on antenna reflectors.

6 Claims, 3 Drawing Sheets

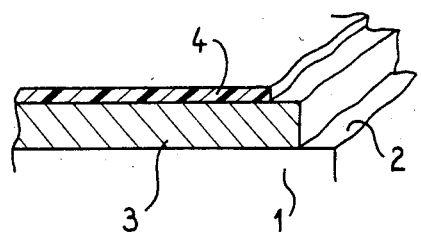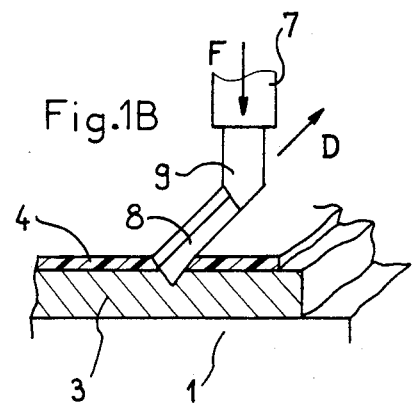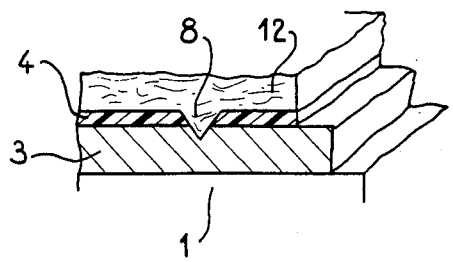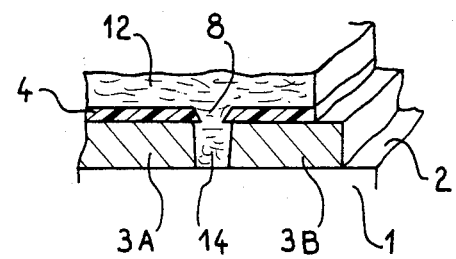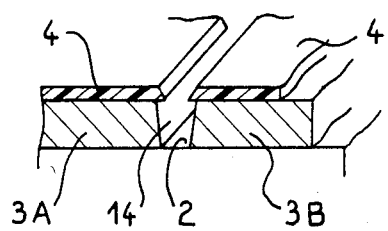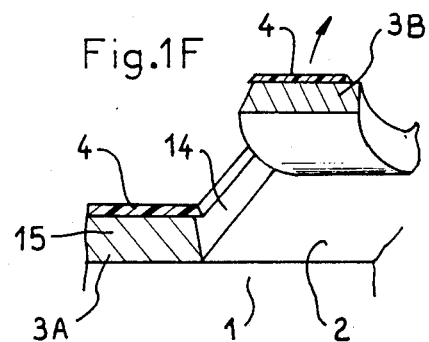

PROCESS FOR MAKING ELECTRICALLY CONDUCTIVE LINES ON A NON-DEVELOPABLE SURFACE OF AN INSULATING SUBSTRATE, TOOL FOR CARRYING OUT THE PROCESS AND DEVICE OBTAINED THEREBY

The present invention relates to a process for the production of electrically conductive lines on a non-developable surface of an insulating substrate. It is particularly, although not exclusively, suitable for producing, on a paraboloid, a polarization grid (antenna with re-utilization of frequency) or a series of resonant patterns (dichroic antennas). The invention also relates to a tool for making the electrically conductive lines on such a substrate, as well as to the devices comprising such a substrate of which said non-developable surface bears said electrically conductive lines, made according to the process.

To make a printed circuit on a plane face of an electrically insulating substrate, it is known that, firstly, said surface is uniformly coated with a layer of a metal, such as copper or aluminium, after which this metal layer is itself uniformly coated with a photosensitive product. The photosensitive product is then exposed to a light beam, through a mask corresponding to the printed circuit to be obtained. Such an exposure renders chemically resistant those parts of the photosensitive product lying plumb with those parts of the metal layer having to form the printed circuit, with the result that an appropriate chemical attack then makes it possible selectively to eliminate those portions of the photosensitive product which have not been rendered chemically resistant by the exposure, as well as those portions of metal layer lying therebeneath.

The desired printed circuit is therefore obtained subsequent to said chemical attack.

If it is desired to apply this method to the production of printed circuits on a non-developable surface, difficulties would arise at the moment of application of the mask on said surface. In fact, for obvious reasons of convenience of production and of precision, such a mask is plane. Said mask would therefore have to be cut into pieces of reduced areas and said pieces applied on said non-developable surface by being juxtaposed, or said mask would have to be made of a supple material adapted to be applied by deformation on said surface. In either case, the printed circuit obtained would be imprecise, both as far as the shape and the position of the lines which compose it are concerned.

Moreover, it will be noted that if, in a variant, said printed circuit is made on a plane auxiliary substrate adapted to be subsequently applied on the nondevelopable surface, the same difficulties are encountered as those set forth hereinabove concerning the masks.

It is an object of the present invention to overcome these drawbacks and to enable precise printed circuits to be produced directly on non-developable surfaces.

To this end, according to the invention, the process for making electrically conductive lines on a non-developable surface of an electrically insulating substrate, whereby said surface is firstly uniformly coated with a layer of an electrically conductive matter, said layer being in turn coated with a layer of a protective matter, after which said layer of protective matter and said layer of electrically conductive matter are subjected to the action of a chemical agent for the purpose of selectively eliminating those portions of said layer of electrically conductive matter not corresponding to said lines, is noteworthy in that, after formation of said layers of conductive matter and of protective matter, the contour of said lines is mechanically traced thereon by means of a tool hollowing out grooves of which the depth is at least equal to the thickness of said protective layer, then said layers are subjected to the action of a chemical agent capable of attacking said electrically conductive matter without attacking said protective matter, this chemical attack operation being continued for a sufficient period of time for said electrically conductive matter to be eliminated over the whole of its thickness plumb with said grooves, after which those parts of said layer of electrically conductive matter outside said lines are separated from the substrate by peeling.

In this way, thanks to the process of the invention, electrically conductive lines may be made directly on non-developable surfaces without resorting to a mask or an auxiliary substrate with which, moreover, it would be technically difficult to obtain lines which are as precise, both from the standpoint of their shape and their position on said surfaces.

The tool necessary for tracing the contours of said lines may advantageously be an engraving point disposed so as to remain at least substantially orthogonal to said layers of protective matter and of conductive matter. However, in a variant embodiment of the process, the engraving point may be replaced by a cutting blade, more particularly adapted in the case of the path of the tool remaining substantially rectilinear.

The engraving point enables contours of lines of complex shapes to be produced.

In order to facilitate separation, by peeling, of those parts of said layer of electrically conductive matter outside said lines, at least one incipient detachment is provided on said parts. Those parts of the conductive layer outside said lines are then separated, by pulling, by means of a gripping tool gripping said incipient detachments.

The chemical agent which selectively eliminates said layer of conductive matter may preferably be iron perchloride, when said layer is made of copper, or soda, when said layer is made of aluminium.

Said layer of protective matter, insensitive to the action of said chemical agent, may be an organic varnish, a coating of oxide or a noble metal.

For carrying out the process, the tool according to the invention advantageously comprises an engraving point mounted in a head via a sliding assembly which, on the one hand, is pressed outwardly by elastic means capable of being compressed when said point is applied against a surface to be engraved, and, on the other hand, is guided in its displacements by guiding means borne on said head.

The invention also relates to a device comprising an electrically insulating substrate bearing electrically conducting lines on one of its non-developable surfaces and noteworthy in that said electrically conductive lines are made by carrying out the process according to the invention as set forth hereinabove.

The invention will be more readily understood on reading the following description with reference to the accompanying drawings, in which:

FIGS. 1A, 1B, 1C, 1E and 1F illustrate different phases of the process according to the invention.

Figure 2:
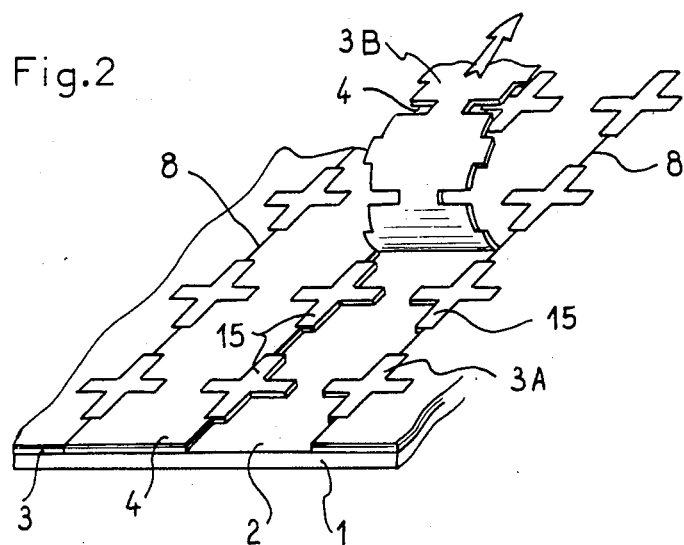
FIG. 2 illustrates, in perspective, with the aid of a particular embodiment, the final phase of the process according to the invention.

Referring now to the drawings, the process according to the invention, described with reference to FIGS. 1A to 1F, is intended to produce electrically conductive lines directly on a non-developable surface of an insulating substrate.

In FIG. 1A, the insulating substrate 1, shown partially, is of any shape, concave or convex, and is, for example, made of a composite material reinforced with glass fiber or aramid. One face 2 of the substrate 1 is coated uniformly with a layer 3 of an electrically conductive matter, for example metal. Layer 3 is in turn coated with a layer 4 of protective matter. The substrate 1 is thus coated with a first, conductive, layer 3 and with a second, protective, layer 4 disposed on the first layer 3.

According to the process of the invention, the contour of the lines to be obtained is traced (FIG. 1B) mechanically on the layers 3 and 4, by means of a tool 7 hollowing out grooves 8.

The tool 7 is constituted by an active part, such as an engraving point 9, and works in a diretion of effort symbolized by an arrow F substantially normal to layers 3 and 4 and this whatever the shape (paraboloid, hyperboloid, . . . ) of said substrate 1. The depth of the grooves 8, traced by the engraving point 9 of the tool 7, is at least equal to the thickness of the protective layer 4. In FIG. 1B, the groove 8 shown also penetrates in the conductive layer 3.

The engraving point 9 is made of a material of considerable hardness, such as carbide or a diamond. During this phase of the process, the displacement, symbolized by an arrow D, and the direction of effort F of the tool 7 are carefully defined and controlled in order to obtain a line which is as fine and as precise as possible.

In a variant embodiment (not shown), the engraving point 9 may be replaced by a cutting blade, adapted more particularly to the case of the path of the tool remaining substantially rectilinear (production of wires or bands for example).

According to the process of the invention (FIGS. 1C and 1D), the protective layer 4 and conductive layer 3 are then subjected to the action of a chemical agent 12.

The chemical agent 12 is deposited on the layer 4 for example by projection or by dipping.

This chemical agent 12 attacks, through the previously machined grooves 8, the layer of electrically conductive matter 3, without attacking the layer of protective matter 4. The chemical agent 12, then selectively eliminating the conducting layer 3, is for example iron perchloride when the layer 3 is made of copper, or soda when layer 3 is made of aluminium.

The protective layer 4, insensitive to the action of the chemical agent 12, is constituted for example by an organic varnish, a coating of oxide, or a noble metal.

The action of the chemical agent 12 on the conductive layer 3 is continued until the latter is eliminated over the whole of its thickness plumb with grooves 8 (FIG. 1D). In this way, said conductive layer 3 comprises parts 3A and 3B separated from each other by grooves 14 in register with the grooves 8 initially made.

The grooves 14 attain the face 2 of the composite substrate 1, insensitive to the action of said chemical agent 12.

By way of example, in the case of a copper conductive layer 3, 35 micrometers thick, the time of engraving at ambient temperature with the aid of a chemical agent such as iron perchloride projected under pressure is of the order of 8 minutes and the width of the engraving thus obtained and therefore of the grooves 14 separating parts 3A and 3B, does not exceed 100 micrometers.

The whole of the substrate 1 and said partially cut-out layers 3 and 4 are then rinsed.

The last phase of the process then consists (FIG. 1F) in separating from the substrate 1, by peeling, those parts of the conductive layer 3 outside the lines to be obtained.

For example, parts 3B of the layer 3 are removed and parts 3A corresponding to the desired lines 15 are conserved. So as to facilitate peeling of parts 3B, at least one incipient detachment (not shown in FIGS. 1F and 2) is formed by means of a tool such as a scraper, between parts 3B and the face 2 of the substrate 1. Parts 3B (coated with the corresponding part of the protective layer 4) is then separated from the face 2 of the substrate 1 by pulling, by means of a gripping tool gripping said incipient detachment. The effort of traction exerted on said layer during separation thereof, by peeling, from the substrate by means of the gripping tool, such as pincers, is maintained lower than the mechanical resistance to breaking of the metal conductive layer.

In this way, parts 3B are continuously eliminated from face 2 of the substrate 1, avoiding the risk of delamination. Once the parts 3B have been totally removed from substrate 1, all that remains thereon are parts 3A coated with the remaining protective layer 4, and corresponding to the desired lines 15.

A particular example of electrically conductive lines 15 is illustrated in FIG. 2. This perspective shows again the substrate 1 coated with the first conductive layer 3, on which is deposited the second protective layer 4. After employing the engraving point 9 of tool 7, determining the contour of the lines 15 to be obtained by grooves 8, and the action of the chemical agent 12, parts 3B outside said lines 15 to be obtained are removed by peeling, in the direction of the arrow indicated in the Figure.

Parts 3B are coated with the corresponding parts of layer 4. An array of lines 15, for example in the form of a cross, is then obtained, in relief with respect to face 2 of the substrate 1.

The process of the invention thus overcomes the drawbacks of the processes of the prior art and enables precise lines, for example printed circuits, to be made directly on non-developable surfaces.

Figure 3:
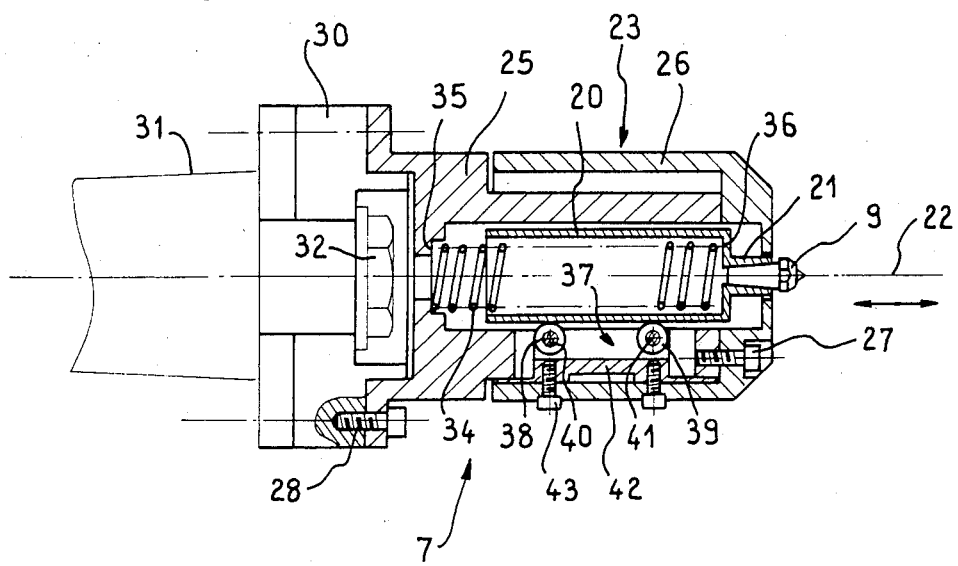
FIG. 3 shows, in section, a tool for carrying out the process.

An embodiment of the tool for carrying out the process is shown, in section, in FIG. 3.

The tool 7 comprises a sliding assembly 20, substantially of hollow cylindrical form, receiving at one of its ends 21 the engraving point 9, for example cut as a 90° prism. The latter and the sliding assembly 20 present, for example, a common axis 22.

The sliding assembly 20 is mounted in a head 23 which surrounds it and it is capable of moving in reciprocating manner with respect to said head 23, along axis 22. Two parts 25 and 26 compose the head 23 and are fixed together by screws 27. Moreover, part 25 of the head 23 is fast by means of screws 28 with an adapter 30 which is connected to an assembly cone 31 of a machine (not shown), by a nut 32. This machine may for example be numerically controlled.

The sliding assembly 20, bearing the engraving point 9, is pushed by elastic means constituted by a spring 34, abutting on the one hand against the rear end 35 of the fixed part 25 and on the other hand against a shoulder 36 made in the vicinity of the end 21 of the mobile slide 20. The spring 34 is compressed when said engraving point 9 is applied against the protective and conductive layers coating the substrate, described hereinbefore.

Moreover, in order to ensure a precise displacement of the mobile slide 20 along axis 22, it is guided in its reciprocating movements by guiding means constituted by three sets 37 of two rollers 38 and 39.

These sets of guiding means 37 are disposed at 120° with respect to one another about axis 22. The rollers 38 and 39 are mounted about pins 40, 41 respectively, arranged in a sleeve 42, which is fixed to part 26 of the head 23 by means of screws 43. In this way, the sliding assembly 20 provided with the engraving point 9 is pressed and guided in the direction of the substrate to be machined, the spring 34 maintaining a constant effort of the engraving point on said layers 3 and 4.

Figure 4:
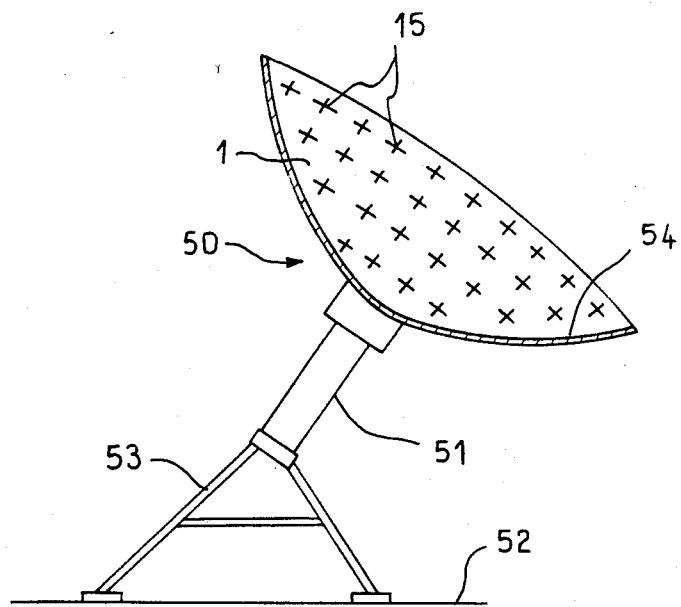
FIG. 4 shows an application of said process to a device, illustrated schematically, of the type comprising a reflector.

One application of the process of the invention is illustrated with reference to FIG. 4. An antenna reflector 50, schematically shown in section, is mounted on a support 51, which cooperates with a support surface 52 via arms 53. The reflector 50 presents a non-developable surface, for example in the form of a paraboloid 54. This surface 54 bears an insulating substrate 1 provided with an array of electrically conductive lines 15, made directly on the surface 54 by carrying out the process according to the invention. The lines 15 obtained are for example those shown in FIG. 2. Such a production of lines is particularly adapted to dichroic reflectors.

What is claimed is:

1. A process for making electrically conductive lines on a non-developable surface of an electrically insulating substrate, whereby said surface is firstly uniformly coated with a layer of an electrically conductive matter, said layer being in turn coated with a layer of a protective matter, after which said layer of protective matter and said layer of electrically conductive matter are subjected to the action of a chemical agent for the purpose of selectively eliminating those portions of said layer of electrically conductive matter not corresponding to said lines, process comprising the following steps:

after formation of said layers of conductive matter and of protective matter, mechanically tracing thereon the contour of said lines by means of a tool hollowing out grooves of which the depth is at least equal to the thickness of said protective layer, then subjecting said layers to the action of a chemical agent capable of attacking said electrically conductive matter without attacking said protective matter, this chemical attack operation being continued for a sufficient period of time for said electrically conductive matter to be eliminated over the whole of its thickness plumb with said grooves, thereafter separating from the substrate, by peeling, those parts of said layer of electrically conductive matter outside said lines.

2. Process for making a printed circuit having electrically conductive patterns disposed on a non-developable surface of an electrically insulating substrate, said process comprising the steps of:

(a) coating said substrate with an electrically conductive layer;

(b) coating said electrically conductive layer with a resist coating;

(c) mechanically tracing on said resist coating the contour of said electrically conductive patterns with a cutting tool hollowing out grooves, the depth of said grooves being at least equal to the thickness of said resist coating;

(d) etching said electrically conductive layer through said grooves up to said electrically insulating substrate; and (e) eliminating from the substrate, by peeling, the parts of said electrically conductive layer and said resist coating, outside said patters.

3. The process of claim 2, wherein, prior to peeling, at least one incipient detachment is provided on those parts of said conductive layer outside said lines.

4. The process of claim 3, wherein those parts of the conductive layer outside said lines are separated, by pulling, by means of a gripping tool gripping said incipient detachment.

5. The process of claim 2, wherein the chemical agent which selectively eliminates said layer of conductive matter is iron perchloride, when said layer is made of copper, or soda, when said layer is made of aluminium.

6. The process of claim 2, wherein said layer of protective matter, insensitive to the action of said chemical agent, is an organic varnish, a coating of oxide or a noble metal.

* * * * *